United States Patent
Goktepeli et al.

(10) Patent No.: US 7,312,129 B2
(45) Date of Patent: Dec. 25, 2007

(54) METHOD FOR PRODUCING TWO GATES CONTROLLING THE SAME CHANNEL

(75) Inventors: Sinan Goktepeli, Austin, TX (US); Alexander B. Hoefler, Austin, TX (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 11/339,101

(22) Filed: Jan. 25, 2006

(65) Prior Publication Data

US 2007/0173024 A1    Jul. 26, 2007

(51) Int. Cl.
*H01L 21/336* (2006.01)
(52) U.S. Cl. .............. 438/304; 438/267; 438/303; 438/596; 257/E21.421
(58) Field of Classification Search .......... 438/304, 438/596, 267; 257/E21.4, E21.623
See application file for complete search history.

(56) References Cited

U.S. PATENT DOCUMENTS 6,124,174 A * 9/2000 Gardner et al. .............. 438/303
7,064,022 B1 * 6/2006 Hill et al. .................... 438/157
2005/0064661 A1   3/2005 Lee et al. ................... 438/257

OTHER PUBLICATIONS

S. Bhattacharya et al., "Improved Performance and Reliability of Split Gate Source-Side Injected Flash Memory Cells," 1996, IEEE, pp. 339-342.
K. Takahashi et al., "A0.9V Operation 2-Transistor Flash Memory for Embedded Logic LSIs," 1999 Symposium on VLSI Technology Digest of Technical Papers, pp. 21-22.
M. Orlowski et al., U.S. Appl. No. 11/240,242, filed Sep. 30, 2005, entitled "A Method of Making a Multi-Bit Non-Volatile Memory (NVM) Cell and Structure".

* cited by examiner

*Primary Examiner*—Michael Lebentritt
*Assistant Examiner*—Cheung Lee
(74) *Attorney, Agent, or Firm*—Hamilton & Terrile, LLP; Michael Rocco Cannatti

(57) ABSTRACT

A semiconductor process and apparatus use a predetermined sequence of patterning and etching steps to etch a gate stack (62) formed over a substrate (11) and a first spacer structure (42), thereby forming etched gate structures (72, 74) that are physically separated from one another but that control a substrate channel (71) subsequently defined in the substrate (11) by source/drain regions (82, 102, 84, 104) that are implanted around the etched gate structures (72, 74). Depending on how the first spacer structure (42) is positioned and configured, the channel (71) may be controlled to provide either a logical AND gate (100) or logical OR gate (200) functionality.

20 Claims, 4 Drawing Sheets

METHOD FOR PRODUCING TWO GATES CONTROLLING THE SAME CHANNEL

BACKGROUND OF THE INVENTION

1. Field of the Invention

The present invention is directed in general to the field of semiconductor devices. In one aspect, the present invention relates to controlling the placement and manufacture of gate electrodes in semiconductor devices.

2. Description of the Related Art

As semiconductor device sizes are scaled down, the requirements for device design and fabrication continue to be tightened in order to fit more circuitry on smaller chips. As device sizes shrink, increasingly complex etch processes are used to define semiconductor devices features, such as polysilicon gates, in close proximity to one another. The same density motivations apply in using MOS transistor devices to design logic devices so that more logic devices are placed on smaller and smaller areas.

Accordingly, a need exists for a semiconductor manufacturing process which provides better control of the fabrication and placement of gate electrodes. In addition, there is a need for a fabrication process which uses MOS transistor devices to form smaller logic components. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
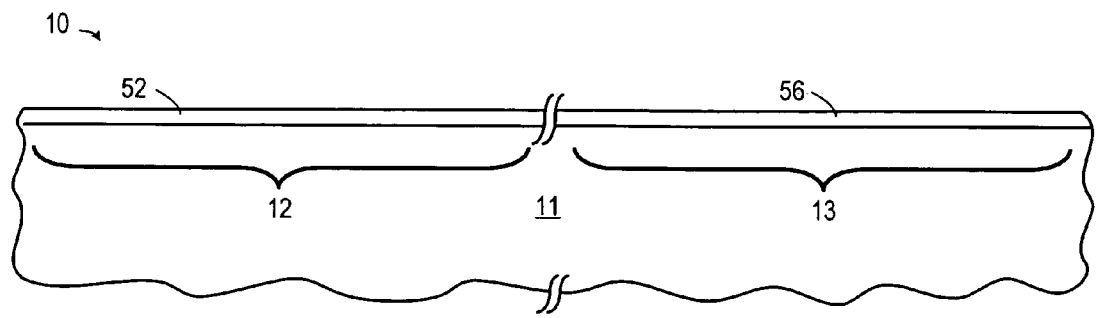
FIG. 1 is a partial cross-sectional view of a semiconductor structure including a substrate and a gate dielectric layer.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating gate electrode features in close proximity to each other for controlling a shared substrate channel region by forming a thin patterned dielectric film on or over a substrate, forming one or more conductive layers and a gate dielectric layer over the substrate and the patterned dielectric film, and polishing and/or etching the conductive layer(s) to form two gates on each side of the thin patterned dielectric film. With this approach, the gates may be completed into a logic device by continuing with the baseline integration for completing transistors to form a source/drain region next to each gate. In an illustrative embodiment, an AND logic device is formed by positioning the thin patterned dielectric film so that there is no overlap with the source/drain regions. With the AND gate configuration, each gate controls only part of the shared substrate channel region between the source/drain regions. To complete the AND gate, each gate is connected to a separate AND gate input, and one of the source/drain regions is connected to an AND gate output. In another embodiment, an OR logic device is formed by positioning the thin patterned dielectric film to overlap with both source/drain regions. With the OR gate configuration, either gate controls the shared substrate channel region between the source/drain regions. To complete the OR gate, each gate is connected to a separate OR gate input, and one of the source/drain regions is connected to an OR gate output.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Turning now to FIG. 1, a partial cross-sectional view is depicted of a semiconductor structure 10, including a substrate 11 and a gate dielectric layer 52, 56 formed over the exposed surfaces of the substrate. Depending on the type of device being fabricated, the substrate 11 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 11 may be implemented as the top silicon layer of a silicon-on-insulator (SOI) structure. As illustrated, the gate dielectric layer 52, 56 is formed by depositing or growing an insulator or high-k dielectric (e.g., nitride, silicon dioxide, oxynitride, metal-oxide, etc.) over the semiconductor substrate 11 using CVD, PECVD, PVD, ALD, thermal oxidation, or any combination(s) thereof to a thickness of approximately 5-200 Angstroms, though a thinner or thicker layer may also be used.

Figure 2:
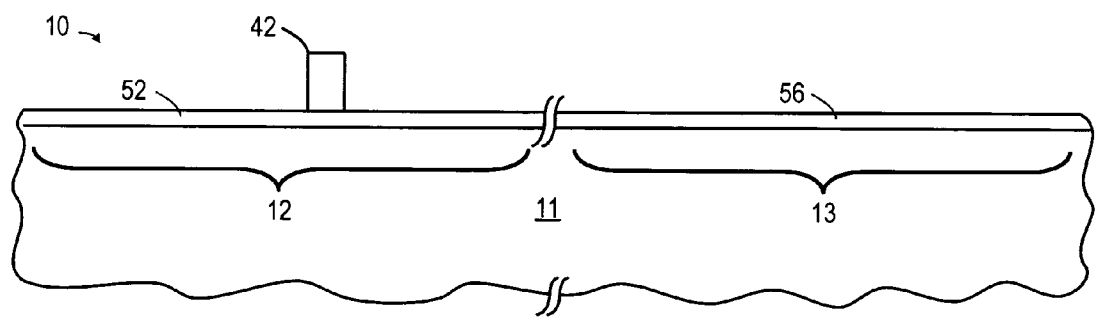
FIG. 2 illustrates processing subsequent to FIG. 1 after a patterned dielectric layer is formed over the gate dielectric layer.

FIG. 2 illustrates processing of the semiconductor structure 10 subsequent to FIG. 1 after a patterned dielectric layer or fin 42 is formed over the gate dielectric layer 52 in a first circuit area 12. In a second circuit area 13, there are no patterned dielectric layers formed. In various embodiments, the patterned insulator or dielectric layer 42 is formed by first depositing or growing a first dielectric layer (e.g., nitride, silicon dioxide, oxynitride, metal-oxide, etc.) over the gate dielectric layer 52, 56 using chemical vapor deposition (CVD), plasma-enhanced chemical vapor deposition (PECVD), physical vapor deposition (PVD), atomic layer deposition (ALD), thermal oxidation, or any combination(s) of the above. However formed, the insulator or dielectric layer may be formed to a thickness of approximately 200-2000 Angstroms, though other thicknesses may be used. Any desired patterning and etch sequence may be used to form the patterned dielectric layer 42, including but not limited to using photoresist or a hard mask to selectively etch the dielectric. In a selected embodiment, the thickness of the thin nitride layer 42 can be controlled down to the 100 Angstrom range using a combination of anisotropic (plasma) etching and isotropic (hot phosphoric acid) etches, though sidewall processes may also be used to form a very thin nitride layer 42. In an illustrative embodiment, the dimensions of patterned layer 42 are nominally 50 nanometers for the height and 100 nanometers for the width, though other dimensions may be used. In other embodiments, the patterned dielectric layer 42 is formed first directly on the substrate 11, followed by deposition of the gate dielectric layer over the patterned dielectric layer 42, in which case the deposited dielectric on the top and sidewalls the dielectric fin 42 could be removed or could be left on the dielectric fin 42.

Figure 3:
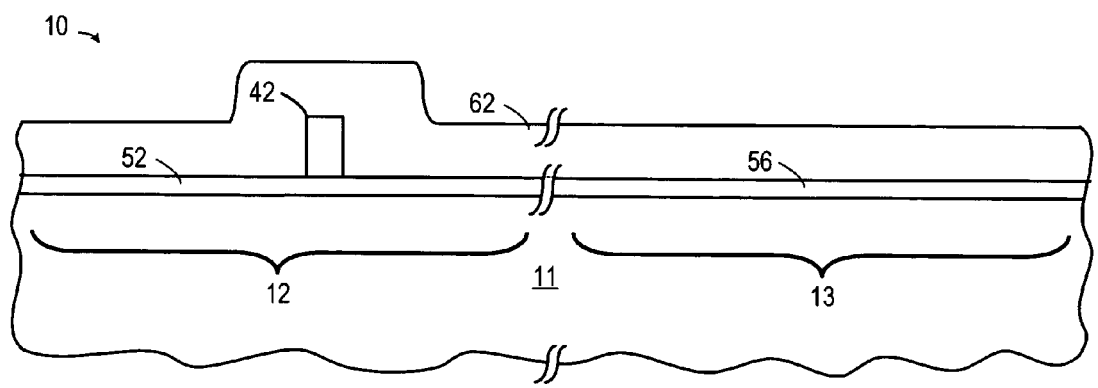
FIG. 3 illustrates processing subsequent to FIG. 2 after one or more gate stack layers are formed over the semiconductor structure.

FIG. 3 illustrates processing of the semiconductor structure 10 subsequent to FIG. 2 after one or more conductive gate stack layers 62 are formed over the patterned dielectric layers 42, gate dielectric layers 52, 56 and substrate 11. In an illustrative embodiment, a conductive gate stack 62 is formed as a layer of polysilicon or SiGe which is blanket deposited over the patterned dielectric layer 42 and gate dielectric layer 52, 56 by CVD, PECVD, PVD, ALD, or any combination(s) thereof to a thickness of approximately 500-2000 Angstroms, though a thinner or thicker layer may also be used. In addition or in the alternative, the conductive gate stack 62 may be formed from or include one or more conductive layers (e.g., metal, silicide or the like), such as a combination of metal and polysilicon layers. The stack 62 formed in this way covers the entire top surface of the silicon substrate 11, including the first and second circuit areas 12, 13.

Figure 4:
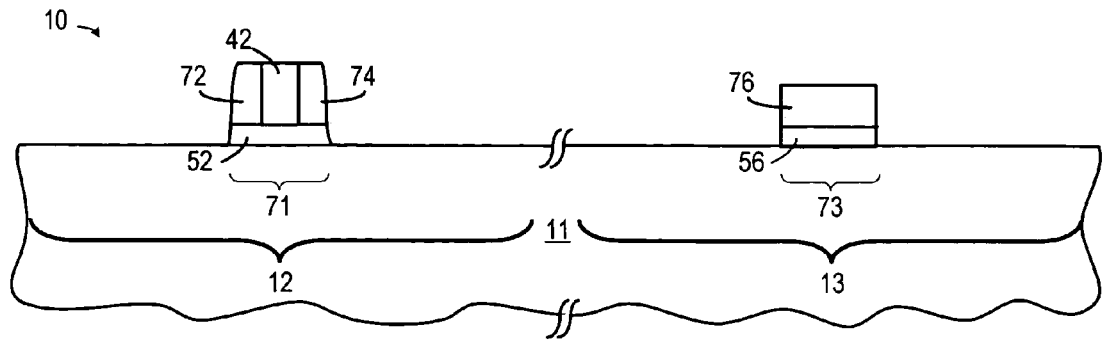
FIG. 4 illustrates processing subsequent to FIG. 3 after the gate stack layers are etched to form gate electrode structures.

FIG. 4 illustrates processing of the semiconductor structure 10 subsequent to FIG. 3 after the conductive gate stack 62 and gate dielectric layers 52, 56 are etched to form etched gate stack structures 72, 74, 76. In the first circuit area 12, the etched gate stack structures may be formed as sidewall spacers 72, 74 around the patterned dielectric layer 42 by anisotropically etching the conformally deposited gate stack layer 62, though any desired gate patterning and etch sequence may be used to form the etched gate stack structures 72, 74, 76, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. In the first circuit area 12, the etched gate stack structures 72, 74 are laterally spaced apart by the patterned dielectric layer 42 to define a first channel region 71 in the substrate 11. By using spacer type etch techniques to form the etched gate structures 72, 74 around the thin nitride layer 42, very narrow etched gate structures 72, 74 may be obtained. And in the second circuit area 13, the etched gate stack structure 76 defines a second channel region 73 in the substrate 11. To protect the polysilicon layer 62 in a second circuit area 13 from the anisotropic etching of the gate stack structures in the first circuit area 12, a mask may be applied to the second circuit area 13 to leave exposed the first circuit area 12 after depositing the polysilicon layer 62 and before anisotropically etching the polysilicon layer. Once the first and second etched gate structures 72, 74 are defined, then the first circuit area 12 may be masked to leave exposed the second circuit area 13 so that the polysilicon layer 62 in those areas may be patterned and etched to define gate electrode structures 76 in the second circuit area 13. Alternatively, when polysilicon layer 62 in the second circuit area 13 is etched, some features in the first circuit area 12 can be intentionally left unmasked. This can be desirable in order to achieve electrical insulation of etched gate structures 72, 74 from each other during this etching step. This step might be necessary since, after the anisotropic etch that creates etched gate structures 72, 74, these structures might remain electrically connected to each other in the third dimension of FIG. 4. Exposing the regions where etched gate structures 72, 74 are connected to each other, during the patterning and etch step of gate electrode structure 76, will electrically disconnect etched gate structures 72, 74 from each other. By virtue of the foregoing sequence of steps, narrow etched gate structures 72, 74 may be formed in a first circuit area while conventional gate electrode structures are formed in the second circuit area. At this point, the source/drain regions may now be formed using the existing or baseline integration sequence to complete these structures into finished devices, such as the logic gate devices described below.

Figure 5:
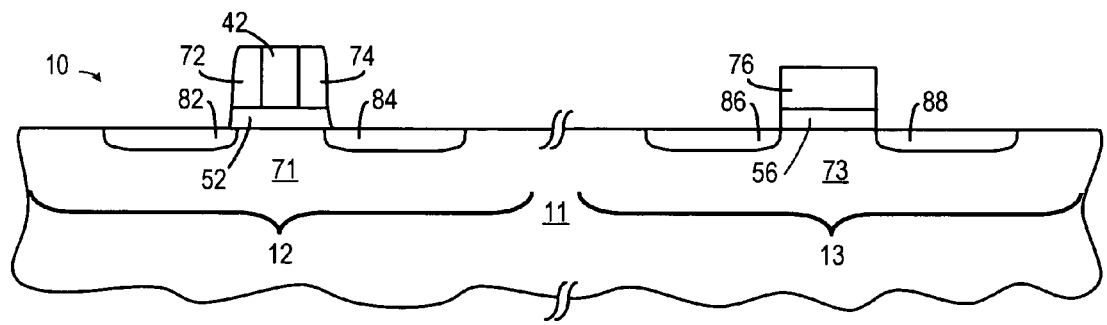
FIG. 5 illustrates processing subsequent to FIG. 4 after first source/drain regions are formed in the substrate.

FIG. 5 illustrates processing of the semiconductor structure 10 subsequent to FIG. 4 after first source/drain regions 82, 84, 86, 88 are formed in the substrate 11. As depicted, the first source/drain regions 82, 84, 86, 88 may be formed by implanting halo regions and/or shallow extension regions around the etched gate stack structures 72, 74, 76 using conventional implanting processes to implant ions having a predetermined conductivity type. For example, when the semiconductor device 10 is intended for N channel operation, the source/drain regions 82, 84, 86, 88 are implanted with arsenic or phosphorus, though other dopants could be used. When the semiconductor device 10 is intended for P channel operation, the source/drain regions 82, 84, 86, 88 are implanted with boron or another appropriate dopant. Of course, with CMOS devices, the implantation is controlled to separately implant N and P type devices. The source/drain regions 82, 84, 86, 88 are shown as being implanted very near the etched gate stack structures 72, 74, 76, though a thin sidewall spacer or liner oxide (not shown) may be formed on the etched gate stack structures 72, 74, 76 prior to implantation. In keeping with conventional processes, the implanted ions are annealed or heated to drive or diffuse the implanted ions into the substrate 11 to form the source and drain regions 82, 84, 86, 88.

Figure 6:
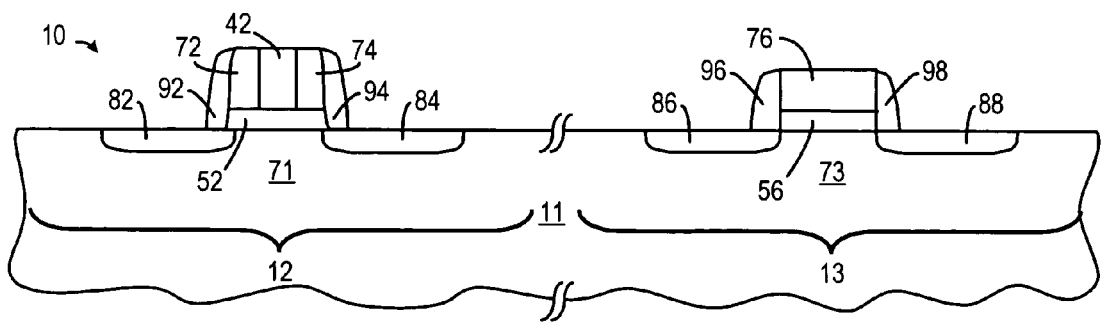
FIG. 6 illustrates processing subsequent to FIG. 5 after first sidewall spacers are formed on the gate electrode structures.

FIG. 6 illustrates processing of the semiconductor structure 10 subsequent to FIG. 5 after first sidewall spacers 92, 94, 96, 98 are formed on the gate electrode structures 72, 74, 76. The first sidewall spacers 92, 94, 96, 98 may be formed by depositing one or more relatively thick dielectric layers (e.g., a 500 Angstrom layer of nitride) over the semiconductor structure 10 using any desired deposition process, and then anisotropically etching the deposited dielectric layer to form the first sidewall spacers 92, 94, 96, 98. Depending on the constituent materials and dimensions of the deposited dielectric layer(s), the etching may use one or more anisotropic etch processes to form first sidewall spacers 92, 94, 96, 98, including a dry etching process (such as reactive-ion etching, ion beam etching, plasma etching, laser etching), a wet etching process (wherein a chemical etchant is employed) or any combination thereof. In a selected illustrative embodiment, the sidewall spacer processing details may be selected to obtain on each side a minimum predetermined total spacer width (e.g., approximately 550-700 Angstroms). As illustrated in the figures, the sidewall spacers 92, 94, 96, 98 (as well as any underlying spacer liner oxide) may be formed on two opposing sides of the gate electrode structures 72, 74, 76, but it will be appreciated that the sidewall spacers 92, 94, 96, 98 (as well as any underlying spacer liner oxide) may be formed on any one or more or all of the exposed sides of the gate electrode structures 72, 74, 76. It will also be appreciated that a spacer or sidewall spacer may be formed from one or more dielectric layers on each side of an etched polysilicon or gate structure by forming physically separate spacers on each side or by forming a single spacer at one or more peripheral sidewalls of the gate electrode structures 72, 74, 76.

Figure 7:
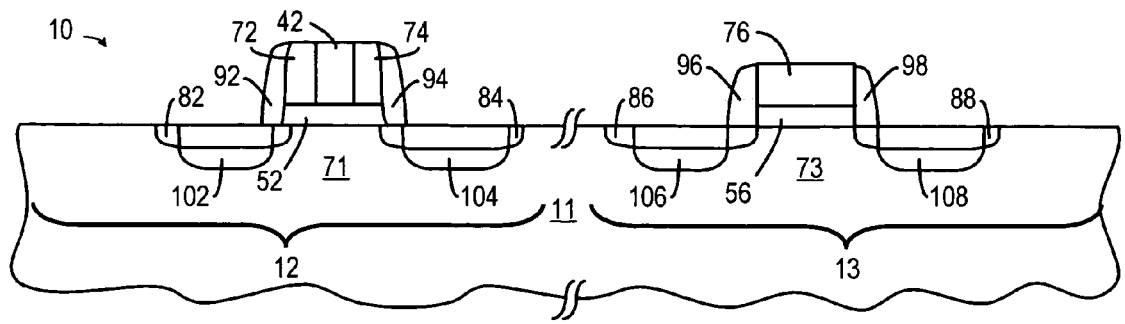
FIG. 7 illustrates processing subsequent to FIG. 6 after second source/drain regions are formed in the substrate.

FIG. 7 illustrates processing of the semiconductor structure 10 subsequent to FIG. 6 after second source/drain regions 102, 104, 106, 108 are formed in the substrate 11. As depicted, the source/drain regions 102, 104, 106, 108 may be formed by implanting the predetermined ions around the etched gate stack structures 72, 74, 76 and first sidewall spacers 92, 94, 96, 98, again using conventional implanting processes. For example, the source/drain regions 102, 104, 106, 108 may be formed as deep source/drain regions using the appropriate dopant for the intended type of device (e.g., NMOS or PMOS). In keeping with conventional processes, the implanted ions are annealed or heated to drive or diffuse the implanted ions into the substrate 11 to form the source/drain regions 102, 104, 106, 108.

As a result of the foregoing sequence of processing steps, each of the etched gate stack structures 76 in the second circuit area 13 acts as a gate to control the second channel region 73 between a third source/drain region 86, 106 and a fourth source/drain region 88, 108. Such structures may be used as conventional MOSFET transistor devices to form conventional circuitry, such as memory or processor circuitry.

Figure 8:
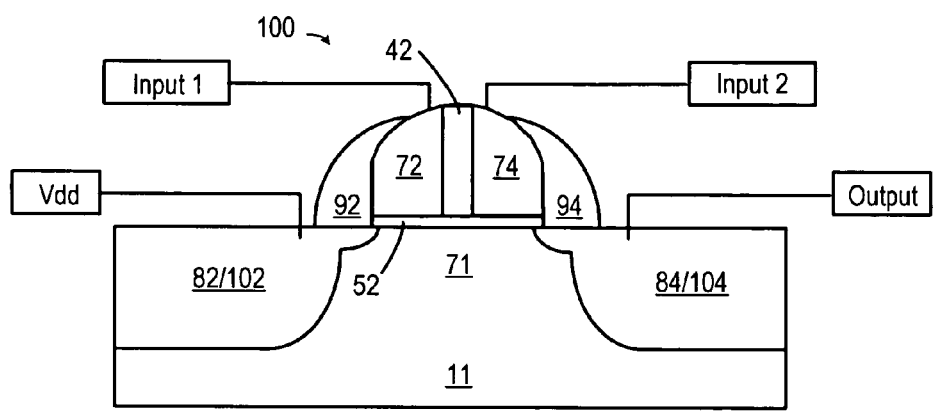
FIG. 8 illustrates a cross-sectional view of an AND gate device which may be formed in accordance with various embodiments of the present invention.
Figure 9:
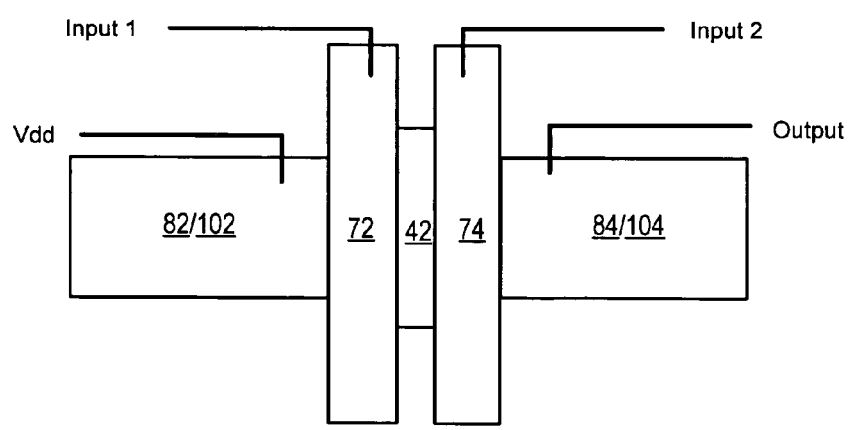
FIG. 9 is a simplified top view of semiconductor structure shown in FIG. 8.

In addition, the foregoing sequence of processing steps results in the formation of etched gate stack structures 72, 74 in the first circuit area 12, each of which is effective as a gate that controls part of the first channel region 71 between a first source/drain region 82, 102 and a second source/drain region 84, 104. With this configuration, the semiconductor structure 10 may be completed and connected to form an AND logic gate device which uses the thin patterned dielectric layer 42 to divide control over the first channel region 71 between the first and second etched gate stack structures 72, 74 as depicted in FIG. 8 which illustrates an AND gate device 100 which may be formed in accordance with various embodiments of the present invention. In the depicted configuration, the first source/drain region 82, 102 is connected to a predetermined or reference voltage (e.g., Vdd), the second source/drain region 84, 104 is connected as a device output and two device inputs (Input 1 and Input 2) are connected to the first and second etched gate stack structures 72, 74, respectively. The placement of the thin patterned dielectric layer 42 in relation to the source/drain regions 82, 102, 84, 104 and the etched gate stack structures 72, 74 is shown in FIG. 9 which is a simplified top view of semiconductor structure 10 at the same stage in processing as shown in FIG. 8. As depicted in FIG. 9, the thin patterned dielectric layer 42 separates the first and second etched gate stack structures 72, 74 with a thickness that permits a conductive channel to be formed in the first channel region 71 between the first source/drain region 82, 102 and the second source/drain region 84, 104 only if both the first and second etched gate stack structures 72, 74 are "high" or "on." Because of the placement of the thin patterned dielectric layer 42 over the first channel region 71 and between the first and second etched gate stack structures 72, 74, neither gate stack structure alone controls the first channel region 71. As a result, the predetermined or reference voltage (e.g., Vdd) is only passed across the channel region 71 if both of the inputs at the first and second etched gate stack structures 72, 74 are "high" or "on." Otherwise, if either or both of the inputs are "low" or "off," then the predetermined or reference voltage (e.g., Vdd) is not passed across the channel region 71 to the output. Since this electrical performance outputs a "one" only if both of the inputs are "one," the device 100 is an AND logic gate device.

Figure 10:
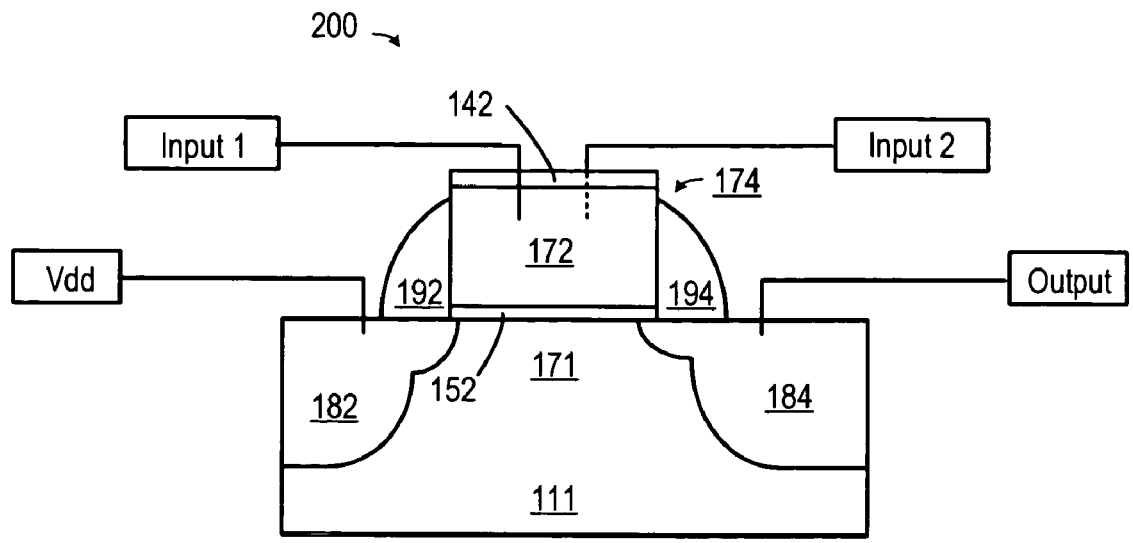
FIG. 10 illustrates a cross-sectional view of an OR gate device which may be formed in accordance with various embodiments of the present invention.
Figure 11:
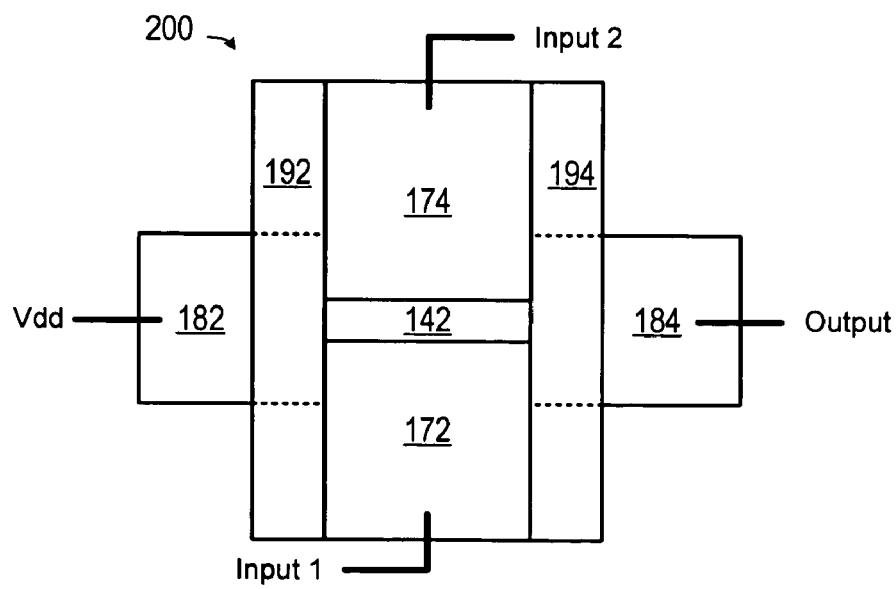
FIG. 11 is a simplified top view of semiconductor structure shown in FIG. 10.

By slightly modifying the foregoing sequence of processing steps, etched gate stack structures may be formed so that each is effective as a gate that controls the underlying channel region between a pair of source/drain regions. With this configuration, a semiconductor structure may be completed and connected to form an OR logic gate device which uses a thin patterned dielectric layer that is positioned to bridge two source/drain regions so as to separate two etched gate stack structures, each of which control an underlying channel region between first and second source/drain regions. An illustrative embodiment is depicted in FIG. 10 which illustrates an OR gate device 200 which may be formed in accordance with various embodiments of the present invention. In the depicted configuration, the first source/drain region 182 is connected to a predetermined or reference voltage (e.g., Vdd), the second source/drain region 184 is connected as a device output and two device inputs (Input 1 and Input 2) are connected to the first and second etched gate stack structures 172, 174, respectively. In FIG. 10, the first etched gate stack structure 172 is illustrated as being in front of and shorter than the thin patterned dielectric layer 142, while the second etched gate stack structure 174 (to which is connected Input 2) is positioned behind the thin patterned dielectric layer 142 (as indicated by the arrow 174). The placement of the thin patterned dielectric layer 142 in relation to the source/drain regions 182, 184 and the etched gate stack structures 172, 174 is shown in FIG. 11 which is a simplified top view of semiconductor structure 200 at the same stage in processing as shown in FIG. 10. As depicted in FIG. 11, the thin patterned dielectric layer 142 is patterned and positioned to bridge the source/drain regions 182, 184 and separate the first and second etched gate stack structures 172, 174 so that a conductive channel may be formed in the first channel region 171 between the source/drain regions 182, 184 if either of the first or second etched gate stack structures 172, 174 are "high" or "on." Because of the placement of the thin patterned dielectric layer 142 over the first channel region 171 and between the first and second etched gate stack structures 172, 174, either gate stack structure controls the first channel region 171. As a result, the predetermined or reference voltage (e.g., Vdd) is passed across the channel region 171 if either or both of the inputs at the first and second etched gate stack structures 172, 174 are "high" or "on." Only if both of the inputs are "low" or "off" is the predetermined or reference voltage (e.g., Vdd) not passed across the channel region 171 to the output. Since this electrical performance outputs a "one" if either or both of the inputs are "one," the device 200 is an OR logic gate device.

It will be appreciated that additional processing steps will be used to complete the fabrication of the gate electrodes into functioning transistors or devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

In one form, there is provided herein a method for fabricating a semiconductor device using a first spacer structure (e.g., a thin patterned nitride layer that is formed over the substrate) to define first and second etched gate structures and gate dielectric layers formed adjacent to the sidewalls of the first spacer structure. In a selected embodiment, the etched gate structures are defined by depositing a polysilicon layer over the substrate and first spacer structure and then anisotropically etching the polysilicon layer to form first and second etched gate structures on each side of the first spacer structure. To protect the polysilicon layer in other circuit areas from the anisotropic etching, a mask may be applied to the other circuit areas to leave exposed a first circuit area after depositing the polysilicon layer and before anisotropically etching the polysilicon layer. Once the first and second etched gate structures are defined, then the first circuit area may be masked to leave exposed, the other circuit areas so that the polysilicon layer in those areas may be patterned and etched to define gate electrode structures in the other circuit areas. With the first and second etched gate structures in place, first and second source/drain regions are then formed in the substrate to define a channel that is controlled by the first and second etched gate structures, depending on how the first spacer structure is positioned and configured. In a selected embodiment, the first and second source/drain regions may be formed by implanting ions having a predetermined conductivity type around sidewall spacers formed adjacent to the first and second etched gate structures. In the completed semiconductor device, the channel is controlled by the combination of the first and second etched gate structures to provide a logical AND gate device functionality when the first spacer structure is located between the first and second source/drain regions. This can be accomplished by electrically connecting the first and second etched gate structures to first and second device inputs, electrically connecting the first source/drain region to a predetermined voltage and electrically connecting the second source/drain region to a device output. On the other hand, the channel is controlled by either of the first and second etched gate structures to provide a logical OR gate device functionality when the first spacer structure bridges between the first and second source/drain regions using the same electrical connection steps.

In another form, there is provided a method for forming a transistor having two gates for controlling a shared channel. Under the method, a nitride fin is formed on or over a substrate so that it is positioned between subsequently defined first and second source/drain regions or so that it is positioned to bridge between subsequently defined first and second source/drain regions. In addition, a gate dielectric layer is formed, either by depositing a dielectric layer on the nitride fin and substrate, or by forming the dielectric layer on the substrate prior to formation of the nitride fin. Next, a conductive gate stack (e.g., a polysilicon layer) is deposited over the nitride fin and gate dielectric. After forming a mask to leave exposed a first circuit area, the conductive gate stack in the first circuit area (and optionally any exposed gate dielectric layer) is etched (e.g., anisotropically) to form first and second gate structures adjacent the nitride fin. By forming source/drain regions in the substrate adjacent to the first and second gate structures, a shared channel is defined that is controlled by the first and second gate structures. Depending on the positioning of the nitride fin, logic gate devices (e.g, logical AND gate or a logical OR gate devices) may be formed by electrically connecting the first gate structure to a first device input, electrically connecting the second gate structure to a second device input, electrically connecting the first source/drain region to a predetermined voltage and electrically connecting the second source/drain region to a device output. As will be appreciated, gate electrode structures may be separately formed in a second circuit area by forming a masking layer after the conductive gate stack in the first circuit area is etched to leave exposed a second circuit area in which the conductive gate stack is then etched to define the gate electrode structures, though it will be appreciated that the masking sequence may be reversed. When the conductive gate stack in the second circuit area is etched, etched gate structures in the first circuit area may be masked and protected against the etch process applied to the second circuit area, or may be exposed to the etch process so that any etched gate structures in the first circuit area that are electrically connected may be electrically disconnected by the etch process.

In yet another form, there is provided method for fabricating two gates controlling a single channel by forming a spacer structure over a substrate (either directly or on a gate dielectric), depositing a polysilicon layer over the substrate and spacer structure, anisotropically etching the polysilicon layer to form first and second poly gates adjacent to the spacer structure, and then forming first and second source/drain regions in the substrate adjacent to the first and second poly gates so that the first and second source/drain regions define a single channel that is controlled by the first and second gate structures.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    forming first spacer structure having first and second sidewalls over a substrate;
    forming first and second etched gate structures on a first dielectric layer adjacent to the first and second sidewalls of the first spacer structure; and
    forming first and second source/drain regions in the substrate adjacent to the first and second etched gate structures, said first and second source/drain regions defining a channel that is controlled by the first and second etched gate structures.

2. The method of claim 1, where forming the first spacer structure comprises forming a thin patterned nitride layer on the substrate that is located between subsequently defined first and second source/drain regions.

3. The method of claim 1, where forming the first spacer structure comprises forming a thin patterned nitride layer on the substrate that bridges between subsequently defined first and second source/drain regions.

4. The method of claim 1, where forming first and second etched gate structures comprises:
    depositing a polysilicon layer over the substrate and first spacer structure; and
    anisotropically etching the polysilicon layer to form first and second etched gate structures on each side of the first spacer structure.

5. The method of claim 4, further comprising:
    masking at least a portion of a first circuit area after anisotropically etching the polysilicon layer to leave exposed a second circuit area and parts of the first circuit area in regions where the first and second etched gate structures are electrically connected; and
    etching the polysilicon layer to define one or more gate electrode structures in the second circuit area and to simultaneously disconnect any electrically connected first and second etched gate structures exposed in the first circuit area.

6. The method of claim 1, further comprising forming the first dielectric layer on the substrate prior to forming the first spacer structure.

7. The method of claim 1, further comprising depositing the first dielectric layer over the substrate and first spacer structure after forming the first spacer structure.

8. The method of claim 1, where forming first and second source/drain regions comprises:
    forming sidewall spacers adjacent to the first and second etched gate structures; and
    implanting ions having a predetermined conductivity type around the sidewall spacers and into the substrate.

9. The method of claim 1, further comprising:
    electrically connecting the first etched gate structure to a first device input;
    electrically connecting the second etched gate structure to a second device input;
    electrically connecting the first source/drain region to a predetermined voltage; and
    electrically connecting the second source/drain region to a device output, thereby forming a logic gate device.

10. The method of claim 9, where the logic gate device comprises a logical AND gate device.

11. The method of claim 9, where the logic gate device comprises a logical OR gate device.

12. A method for forming a transistor having two gates for controlling a shared channel, comprising:
    forming a gate dielectric layer on a substrate;
    forming a nitride fin over the gate dielectric layer;
    depositing a polysilicon layer over the nitride fin and gate dielectric layer;
    anisotropically etching at least the polysilicon layer in a first circuit area to form first and second gate structures adjacent the nitride fin; and
    forming first and second source/drain regions in the substrate adjacent to the first and second gate structures, said first and second source/drain regions defining a shared channel that is controlled by the first and second gate structures.

13. The method of claim 12, further comprising:
    forming a masking layer after anisotropically etching at least the polysilicon layer to leave exposed at least a second circuit area;
    etching the polysilicon layer to define one or more gate electrode structures in the second circuit area.

14. The method of claim 13, where etching the polysilicon layer to define one or more gate electrode structures in the second circuit area simultaneously etches first and second etched gate structures in the first circuit area that are electrically connected, thereby disconnecting any electrically connected first and second etched gate structures exposed in the first circuit area.

15. The method of claim 12, where forming the nitride fin on a substrate comprises forming a thin patterned nitride layer on the substrate that is located between subsequently defined first and second source/drain regions.

16. The method of claim 12, where forming a nitride fin on a substrate comprises forming a thin patterned nitride layer on the substrate that bridges between subsequently defined first and second source/drain regions.

17. The method of claim 12, further comprising masking a second circuit area to leave exposed the first circuit area after depositing the polysilicon layer and before anisotropically etching at least the polysilicon layer.

18. The method of claim 12, further comprising etching any exposed gate dielectric layer after anisotropically etching at least the polysilicon layer in the first circuit area.

19. The method of claim 12 further comprising:
   electrically connecting the first gate structure to a first device input;
   electrically connecting the second gate structure to a second device input;
   electrically connecting the first source/drain region to a predetermined voltage; and
   electrically connecting the second source/drain region to a device output, thereby forming a logic gate device comprising a logical AND gate device or a logical OR gate device.

20. A method for fabricating two gates controlling a single channel, comprising:
   forming a spacer structure over a substrate;
   depositing a first polysilicon layer over the spacer structure;
   anisotropically etching the first polysilicon layer to form first and second poly gates adjacent to the spacer structure; and
   forming first and second source/drain regions in the substrate adjacent to the first and second poly gates, said first and second source/drain regions defining a single channel that is controlled by the first and second poly gates.

* * * * *

UNITED STATES PATENT AND TRADEMARK OFFICE
CERTIFICATE OF CORRECTION

| | |
|---|---|
| PATENT NO. | : 7,312,129 B2 |
| APPLICATION NO. | : 11/339101 |
| DATED | : December 25, 2007 |
| INVENTOR(S) | : Sinan Goktepeli |

It is certified that error appears in the above-identified patent and that said Letters Patent is hereby corrected as shown below:

In Column 11, Line 1, Claim No. 16:

Change "where forming a nitride fin" to --where forming the nitride fin--

Signed and Sealed this

First Day of July, 2008

JON W. DUDAS
*Director of the United States Patent and Trademark Office*